United States Patent [19]

Fehr et al.

[11] 4,326,167
[45] Apr. 20, 1982

[54] TEST CIRCUIT FOR HIGH VOLTAGE APPARATUS

[75] Inventors: Werner Fehr, Winterthur; Klaus Dieter Schmidt, Klingnau, both of Switzerland

[73] Assignee: BBC Brown, Boveri & Company, Ltd., Baden, Switzerland

[21] Appl. No.: 76,861

[22] Filed: Sep. 19, 1979

[30] Foreign Application Priority Data

Sep. 29, 1978 [CH] Switzerland .................. 10180/78

[51] Int. Cl.³ ........................................... G01R 31/02
[52] U.S. Cl. ................................. 324/415; 324/424
[58] Field of Search ....................... 324/415, 424, 423; 200/82 R

[56] References Cited

U.S. PATENT DOCUMENTS 2,816,196 12/1957 Daudelin .......................... 200/82 R
2,929,892 3/1960 Blomgren ........................ 200/82 R

FOREIGN PATENT DOCUMENTS 612219 11/1948 United Kingdom ................ 324/415

OTHER PUBLICATIONS

Zedler, H. D.; Elektrie; "SF₆ . . . ", vol. 31; 1977; pp. 321-324.

Primary Examiner—Ernest F. Karlsen
Attorney, Agent, or Firm—Burns, Doane, Swecker & Mathis

[57] ABSTRACT

A test circuit for testing the circuit making or circuit breaking capability of a high voltage apparatus includes a high current source in a high current circuit and a high voltage source in a high voltage circuit. The apparatus to be tested is disposed in the high voltage circuit, and a switch with an explosive actuator is provided in the high current circuit to connect the apparatus thereto during testing. The explosive actuator is connected with a voltage source in the high voltage circuit for ignition thereof by the preignition of the tested apparatus.

4 Claims, 3 Drawing Figures

TEST CIRCUIT FOR HIGH VOLTAGE APPARATUS

BACKGROUND OF THE INVENTION

The present invention relates to a test circuit for testing the circuit making or circuit breaking capability of high voltage apparatus, in particular switches, by means of a high current circuit and a high voltage circuit respectively having a source for generating a large current and source for generating a high voltage. For some time, various test methods for testing the circuit making or breaking capabilty of high voltage apparatus at full voltage rating have been considered by the IEC. In the prior art methods, direct field test performances have proven to be insufficient. Therefore, the testing of the apparatus must be undertaken wht the help of so-called two-circuit switches by which both a high voltage circuit and a high current circuit are connected to the tested apparatus. A high current source in the high current circuit can comprise a high current generator, for example. As high voltage source in the high voltage circuit, it is possible to use a bank of capacitors or a test transformer, as described, for example, in the professional journal, *Elektrie*, Volume 31 (1977), pages 321 to 324.

In the apparatus for carrying out the above-mentioned test method, a spark gap performs the necessary function of isolating the high voltage circuit and the high current circuit from each other. After the switch to be tested has been preignited, the spark gap is actuated as fast as possible, so that the switch to be tested is loaded with the proper switching current. The spark gap thus serves as a high-speed switching element.

The ignition of such a spark gap can take place as described in West German Auslegeschrift No. 1,516,094, for example. In the test arrangement disclosed therein, a series connection of two capacitors and one auxiliary spark gap is connected in parallel with the auxiliary switch to be ignited by means of a capacitance which is small in comparison to the capacitance of the two capacitors. The two capacitors are charged by equal but opposite direct voltages and the voltage produced thereby is sufficient to ignite the auxiliary spark gap as well as the auxiliary switch to be ignited.

Further, West German Offenlegungsschrift No. 2,113,798 discloses a method for reigniting, for a short time, an electric arc between the contacts of a high voltage circuit-breaker by means of an explosive charge which drives a flow of ionized gas between the contacts, whereby at least one or both contacts or electrodes of the spark gap are ionized by the gas.

This previously described method is now indispensable in the case of a spark gap which is used as a high-speed switching element in a test circuit for high voltage apparatus, because the voltage over the spark gap after the preignition of the switch to be tested only amounts to the sum of the voltage of the high current circuit and the electric arc voltage of the switch to be tested. This voltage is generally substantially less than the voltage of the high voltage circuit.

For high voltage test circuits such as those described above, it is extremely difficult to produce spark gaps which features, on one hand, the required response accuracy and which are capable, on the other hand, of conducting the short-circuit current or switching-in test current, as the case may be, for a specified period of time. In addition, such spark gaps must be shunted after the tested response in order not to load them with the switching-in test current for an unnecessarily long period. For this purpose, a high voltage switch having suitable insulation is necessary. Further, the control of the testing procedure is time-consuming and the testing arrangement is relatively complicated owing to the above-mentioned required test circuit elements.

OBJECT AND BRIEF SUMMARY OF THE INVENTION

It is therefore an object of the present invention to considerably simplify high voltage testing circuits by eliminating the need for any spark gap or auxiliary spark gap, as the case may be, as a high-speed switching element and thereby avoid the disadvantages associated with these elements.

This object and its attendant advantages are achieved by utilizing a switch having an explosive actuator to perform the function of connecting the high current circuit to the apparatus to be tested. The advantages which are achieved with the present invention include a simplification of the high voltage test circuit with respect to at least one element of the circuit and also with respect to its control. More particularly, the present invention renders unnecessary auxiliary devices such as an auxiliary switch for shunting of the spark gap which is used as a high-speed switching element. In addition, the spark gaps required for testing high voltage apparatus cannot be immediately procured from the market and therefore require special development with the attendant testing related thereto. The present invention obviates the need for this development and testing.

As a further feature of the invention, the explosive actuator can be ignited by means of a voltage source connected to the high voltage circuit. This arrangement provides a simple means of control of the high current circuit on a high voltage circuit breaker to be tested.

In the preferred embodiment of the invention, the explosively actuated switch consists of a known short circuiting device. This provides a further advantage in that a product available on the market which is subject to continuous advanced development is utilized.

BRIEF DESCRIPTION OF THE DRAWINGS

In order to facilitate an understanding of the present invention, a preferred embodiment thereof will be described in detail with reference to the accompanying drawings, in which.

DETAILED DESCRIPTION

Figure 1:
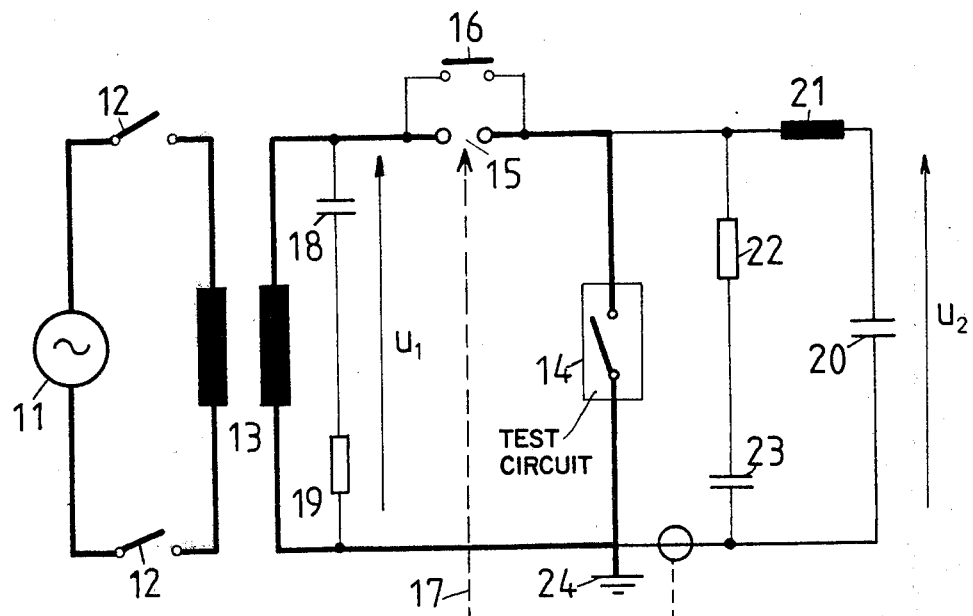
FIG. 1 is a schematic circuit diagram of a prior art testing circuit in which the high voltage source consists of a bank of capacitors.

Referring now to FIG. 1, one form of prior art test circuit includes a high current circuit which consists of a high current generator 11 supplying current to the primary winding of a transformer 13 through a safety switch 12. Connected in series with the secondary winding of the transformer 13 are a test piece 14, such as a switch, and a spark gap 15 which is connected in parallel with an auxiliary switch 16. A tripping device 17 is provided for igniting the spark gap 15. For protection of the high current generator 11 from inadmissibly high voltages, as well as the transformer 13, a series connection of a capacitor 18 and a resistor 19 is connected in parallel with the secondary winding of the transformer 13.

In addition to being connected to the transformer 13 by means of the spark gap 15, the test piece 14 is located in the high voltage circuit. This circit is comprised of a bank of capacitors including a series connection of acapacitor 20 and an inductor 21 in parallel with a resistance 22 and a capacitor 23. The voltage of the high voltage circuit is symbolically indicated by the voltage arrow $u_2$ and the voltage of the high current circuit is symbolically indicated by the voltage arrow $u_1$. The voltage $u_2$ is substantially greater than the voltage $u_1$. The ground potential 24 is connected to one side of the test piece 14.

In the operation of the circuit illustrated in FIG. 1, the circuit making movement of the contacts of the switch 14 results in a disruptive discharge whereby, among other things, the tripping device 17 is activated to ignite the spark gap 15 so that the high current circuit is thereby connected to the test switch 14. The spark gap 15 thereby acts in a well-known manner as a high-speed switching element. This switching element must be connected in parallel with an auxiliary switch 16 in order to avoid too great a burnup as a result of a great load on the shunt.

Figure 2:
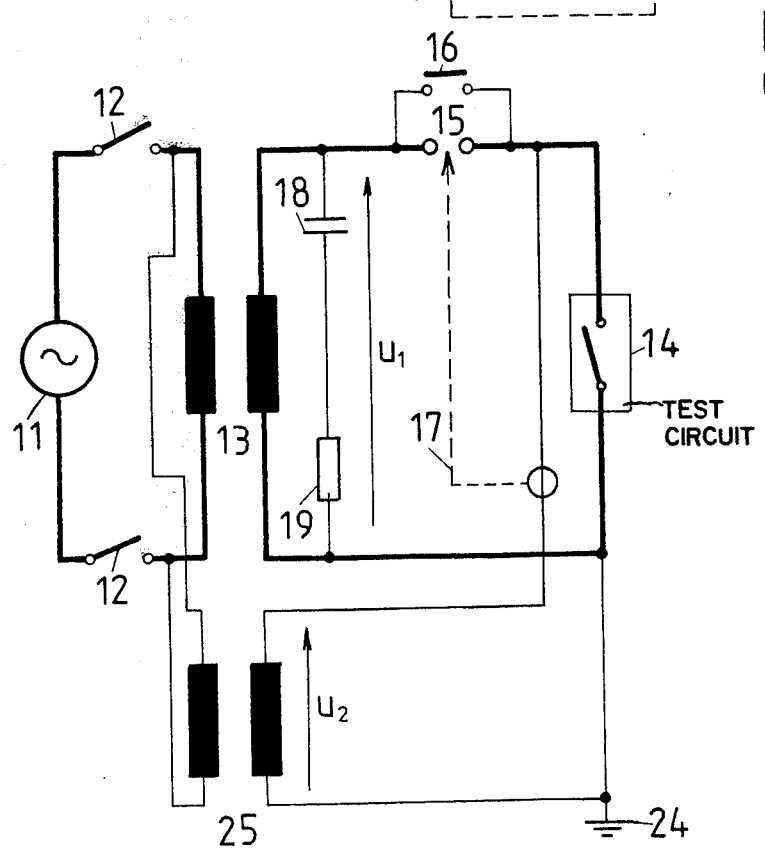
FIG. 2 is a schematic circuit diagram of a prior art testing circuit in which the high voltage source consists of a test transformer.

In the circuit of FIG. 2, the elements corresponding to the circuit elements of FIG. 1 are positioned and labelled the same as in FIG. 1. The prior art test circuit depicted in FIG. 2 features a test transformer 25 instead of a bank of capacitors serving as a high voltage source. A spark gap 15 is provided to isolate the high current circuit from the high voltage circuit in the open state of the test switch 14.

Figure 3:
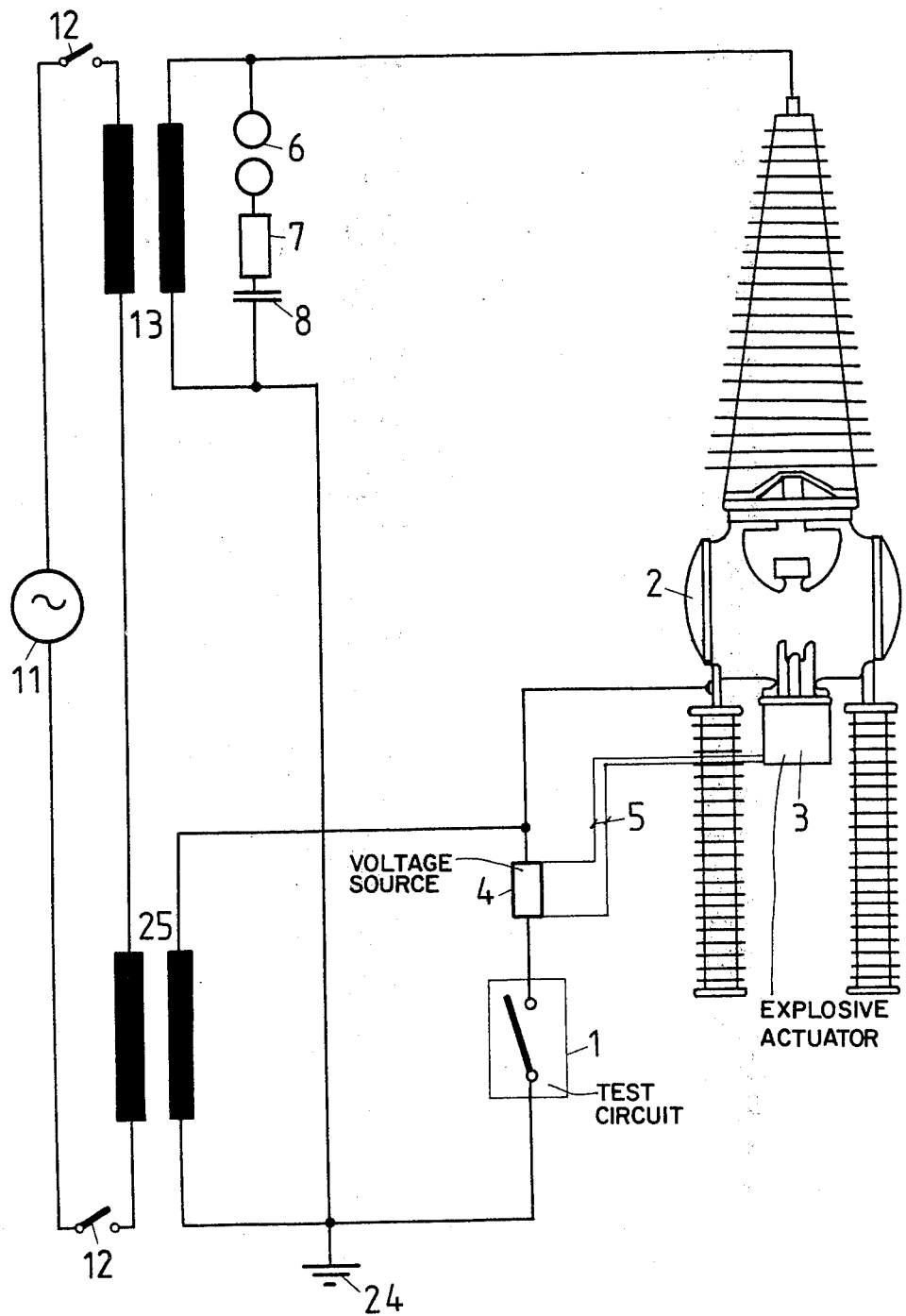
FIG. 3 is a schematic circuit diagram of a test circuit constructed in accordance with the present invention.

In the preferred embodiment of the invention illustrated in FIG. 3, the test circuit elements corresponding to those in FIGS. 1 and 2 are labelled the same as in the figures. The test piece 1 can be a high voltage circuit breaker. Instead of the spark gap 15 and the auxiliary switch 16, a suitable conventional very high-speed switching device 2 having an explosive actuator 3 is provided. A voltage source 4 is connected in the high voltage circuit for igniting the explosive or gas cartridges, as the case may be, of the explosive actuator 3. This voltage source can take the form of a resistor or a coil. The explosive actuator 3 and the voltage source 4 are connected by means of electrical conductors 5. For protection of the high current generator 11 as well as transformer 13 from inadmissibly high voltages, a protection circuit, consisting of a series connection of protective spark gap 6, a resistor 7 and a capacitor 8, is connected in parallel with the secondary winding of the transformer 13.

The high speed switching device 2 is designed such that, in its open state, it provides sufficient insulation between the high voltage circuit and the high current circuit. In its closed state, the high speed switch 2 can conduct the short circuit current or switching-in current from the high current circuit sufficiently long without the need for additional means such as a shunt and, in addition, enables the desired connection of the high current circuit to the voltage circuit breaker to be tested to be carried out in a sufficiently short time period.

The high speed switching device 2 can, more particularly, consist of a short circuiting device with an explosive actuator whereby the explosive actuator, in contrast to the design according to West German Offenlegungsschrift No. 2,113,798, is not used for the production of an electrically conducting gas jet for ionizing a spark gap, but rather for the sudden production of a gas volume with high pressure which drives the mobile contact piece from the saftey ground connection to its switched-in position in sufficiently short time so that the closing times of the short-circuiting device 2 are achieved in less than 1 ms. The short-circuiting device 2 is preferably arranged in a closed housing which is filled with an insulating gas, such as sulfur hexafluoride ($SF_6$), to thereby enable the insulating section of the short-circuiting device can be kept quite small in relation to the corresponding gas pressure which is produced.

When the high current generator 11 is running and the safety switch 12 is closed, an electrical arc is produced between the contact members of the test piece 1 arranged in the high voltage circuit. The explosive actuator 3 is thereby ignited by the voltage source 4 through the electrical conductors 5, and consequently the short-circuiting device 2 is closed and the high current circuit is connected to the switch 1 to be tested. The time between the preignition of the test piece 1 and the connection of the high current circuit to the test piece 1 is as short as possible, in accordance with the requirements of a desirable test circuit.

The present invention may be embodied in other specific forms without departing from the spirit or essential characteristics thereof. The presenting disclosed embodiment is therefore considered in all respects as illustrative and not restrictive. The scope of the invention is indicated by the appended claims rather than the foregoing description, and all changes which come within the meaning and range of equivalency of the claims are therefore intended to be embraced therein.

What is claimed is:

1. A test circuit for testing the circuit-making or circuit breaking capability of high voltage electrical apparatus, comprising:
   a high voltage circuit having a first high voltage source connected to the apparatus to be tested;
   a high current circuit having a source for generating a large current;
   a high speed switch having an explosive actuator and being connected between said high current circuit and the apparatus to be tested for isolating said high current circuit from said high voltage circuit and the tested apparatus connected thereto during an open state thereof and for rapidly connecting said high current circuit to the tested apparatus upon ignition of said explosive actuator; and
   a second voltage source disposed in said high voltage circuit and an electrical conductor for connecting said second voltage source with said explosive actuator to thereby enable said second voltage source to ignite said explosive actuator.

2. The test circuit of claim 1 wherein said voltage source is a resistor.

3. The test circuit of claim 1 wherein said voltage source is a coil.

4. The test circuit of claim 1 wherein said high speed switch comprises a short circuiting device.